United States Patent
Song et al.

(10) Patent No.: US 9,147,513 B2
(45) Date of Patent: Sep. 29, 2015

(54) SERIES INDUCTOR ARRAY IMPLEMENTED AS A SINGLE WINDING AND FILTER INCLUDING THE SAME

(71) Applicant: SAMSUNG ELECTRO-MECHANICS CO., LTD., Suwon, Gyunggi-do (KR)

(72) Inventors: Young Jean Song, Gyunggi-do (KR); Ki Joong Kim, Gyunggi-do (KR); Myeong Woo Han, Gyunggi-do (KR); Shinichi Iizuka, Gyunggi-do (KR); Ju Young Park, Gyunggi-do (KR); Youn Suk Kim, Gyunggi-do (KR); Jun Goo Won, Gyunggi-do (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 250 days.

(21) Appl. No.: 13/779,685

(22) Filed: Feb. 27, 2013

(65) Prior Publication Data
US 2014/0167884 A1 Jun. 19, 2014

(30) Foreign Application Priority Data
Dec. 13, 2012 (KR) .................. 10-2012-0145567

(51) Int. Cl.
*H01F 17/00* (2006.01)
*H03H 7/01* (2006.01)
*H03H 1/00* (2006.01)

(52) U.S. Cl.
CPC ......... *H01F 17/0013* (2013.01); *H03H 7/0115* (2013.01); *H03H 7/1758* (2013.01); *H01F 2017/0026* (2013.01); *H03H 2001/0092* (2013.01)

(58) Field of Classification Search
None
See application file for complete search history.

(56) References Cited

U.S. PATENT DOCUMENTS

| | | | |
|---|---|---|---|
| 5,969,582 A | 10/1999 | Boesch et al. | |
| 7,276,970 B2 * | 10/2007 | Khorramabadi | 330/253 |
| 7,489,220 B2 * | 2/2009 | Baumgartner et al. | 336/200 |
| 2012/0244802 A1 * | 9/2012 | Feng et al. | 455/41.1 |
| 2013/0207739 A1 * | 8/2013 | Bakalski | 333/33 |

FOREIGN PATENT DOCUMENTS

| | | |
|---|---|---|
| JP | 2000-348939 A | 12/2000 |
| JP | 2005-184343 A | 7/2005 |
| KR | 10-0147906 B1 | 5/1998 |

OTHER PUBLICATIONS

Office Action issued on Dec. 11, 2013 in the corresponding Korean patent application No. 10-2012-0145567.

* cited by examiner

Primary Examiner — Cassandra Cox
(74) Attorney, Agent, or Firm — NSIP Law (57) ABSTRACT

There are provided a series inductor array implemented as a single winding capable of decreasing a layout area for providing a plurality of inductors, and a filter including the same, the series inductor array including a winding structure having both ends, and one or more terminal parts electrically connected to a region between the both ends of the winding structure to form an external electrical connection, wherein the winding structure has a structure in which a plurality of inductors having inductance formed in regions of the winding structure disposed between the both ends thereof and the terminal parts or between the terminal parts are connected in series.

9 Claims, 6 Drawing Sheets

FIG. 7 freq (1.000GHz to 20.00GHz)

SERIES INDUCTOR ARRAY IMPLEMENTED AS A SINGLE WINDING AND FILTER INCLUDING THE SAME

CROSS-REFERENCE TO RELATED APPLICATIONS

This application claims the priority of Korean Patent Application No. 10-2012-0145567 filed on Dec. 13, 2012, in the Korean Intellectual Property Office, the disclosure of which is incorporated herein by reference.

BACKGROUND OF THE INVENTION

1. Field of the Invention

The present invention relates to a series inductor array used in a high frequency circuit, or the like, and a filter including the same, and more particularly, to a series inductor array implemented as a single winding capable of decreasing a layout area for providing a plurality of inductors, and a filter including the same.

2. Description of the Related Art

Generally, in a high frequency circuit, various electrical and electronic devices for a high frequency are used, and an inductor, a capacitor, or the like, may be used for matching levels of the electrical and electronic devices with each other.

For example, a low pass filter type matching circuit is used in an output terminal of a power amplifier in the high frequency circuit in order to remove a harmonic component generated in the power amplifier simultaneously with maximizing an output of the power amplifier or implementing 50Ω matching. In this low pass filter type matching circuit, two series inductors connected to a signal line in series and a capacitor connected to a connection node of the two series inductors by a shunt are used. In addition, an additional inductor for removing the harmonic component may be connected between the two series inductors and the shunt capacitor in series.

According to the related art, two series inductors used in the matching circuit are implemented as respective windings. Therefore, in implementing the two series inductors in a physical structure, since each of the inductors is implemented as a single winding, two winding structures should be implemented in a circuit layout. Further, in order to implement an overall matching circuit, three inductors should be formed in a winding structure in the layout, and additionally, a capacitor and a ground pattern should be implemented.

That is, according to the related art, the higher the number of inductors, the larger the layout area of the circuit for actually containing the inductors needs to be, thereby having a negative influence on slimness and lightness of electrical and electronic products using the corresponding circuit.

Therefore, new technology for decreasing a layout area required for implementing a circuit using a plurality of inductors to contribute to miniaturization and slimness of products has been demanded in the art.

SUMMARY OF THE INVENTION

An aspect of the present invention provides a series inductor array implemented as a single winding capable of decreasing a layout area for implementing a plurality of inductors by implementing the plurality of inductors connected in series as a single winding.

In addition, another aspect of the present invention provides a filter including a series inductor array implemented as a single winding.

According to an aspect of the present invention, there is provided a series inductor array implemented as a single winding, the series inductor array including: a winding structure having both ends; and one or more terminal parts electrically connected to a region between the both ends of the winding structure to form an external electrical connection, wherein the winding structure has a structure in which a plurality of inductors having inductance formed in regions of the winding structure disposed between the both ends thereof and the terminal parts or between the terminal parts are connected in series.

The series inductor array may be implemented as a multilayer circuit, and the winding structure may be formed as a conductive pattern on a layer of the multilayer circuit.

The one or more terminal parts may include: a conductive via electrically connected to the region between the both ends of the winding structure; and a conductive pattern formed on a layer above or below the layer on which the winding structure is formed to be electrically connected to the conductive via and forming an external electrical connection.

According to another aspect of the present invention, there is provided a filter including a series inductor array implemented as a single winding, the filter including: a series inductor array including a first winding structure having both ends through which a signal is input and output and one or more terminal parts electrically connected to a region between the both ends of the first winding structure to form an external electrical connection, the first winding structure having a structure in which a plurality of inductors having inductance formed in regions of the first winding structure disposed between the both ends thereof and the terminal parts or between the terminal parts are connected in series; and an electrical device connected to the one or more terminal parts.

The series inductor array may be implemented as a multilayer circuit, and the first winding structure may be formed as a conductive pattern on a layer of the multilayer circuit.

The one or more terminal parts connected to the electrical device may include: a conductive via electrically connected to the region between the both ends of the first winding structure; and a conductive pattern formed on a layer above or below the layer on which the first winding structure is formed to be electrically connected to the conductive via and forming an electrical connection with the electrical device.

The electrical device may be disposed on the layer on which the first winding structure is formed.

The filter may further include a ground pattern formed on the layer on which the first winding structure is formed, to be connected to the electrical device.

The electrical device may include a capacitor.

The electrical device may further include a second winding structure connected between the one or more terminal parts and the capacitor to provide inductance.

The second winding structure and the first winding structure may be formed on the same layer.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Hereinafter, embodiments of the present invention will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like elements.

Figure 1:
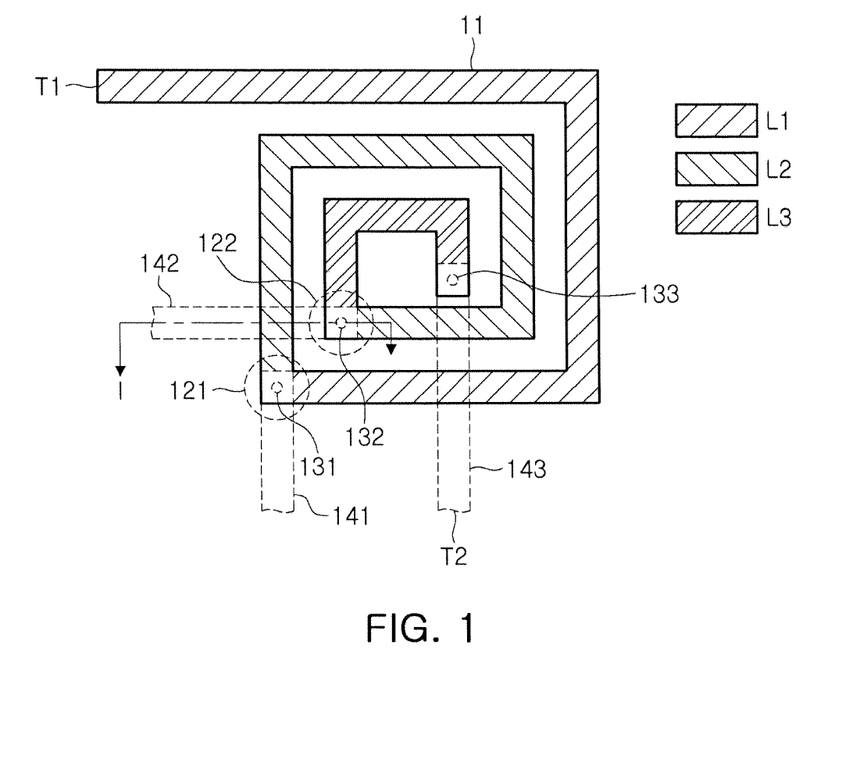
FIG. 1 is a plan view illustrating a series inductor array implemented as a single winding according to an embodiment of the present invention.

FIG. 1 is a plan view illustrating a series inductor array implemented as a single winding according to an embodiment of the present invention.

Referring to FIG. 1, the series inductor array implemented as a single winding may include a winding structure 11 and one or more terminal parts connected to a region of the winding structure to form an external electrical connection.

The winding structure 11 may have a coil-shaped pattern formed using a conductive material on a circuit board and provide inductance. In the embodiment of the present invention, as the circuit board, a multilayer circuit board may be used, and the winding structure 11 may be formed on one layer of the multilayer circuit board. As the board used to implement the series inductor array according to the embodiment of the present invention, a board formed of various materials and known in the art may be used. For example, in order to implement inductors as integrated circuit (IC) inductors, the multilayer circuit board may be manufactured using a silicon board widely used in the field of semiconductors. In addition, the multilayer circuit board may be manufactured using a ceramic board known in the field of low temperature co-fired ceramics (LTCC), a general printed circuit board known as a PCB, or the like.

The case in which the winding structure 11 is bent at an angle of about 90 degrees to have a coil shape is shown by way of example in FIG. 1, but the winding structure 11 may have a spiral shape in which the winding structure 11 does not have a bent part and is rotated in a curved manner or has a shape in which the winding structure 11 has a plurality of bent parts bent at an angle of 90 degrees or greater.

The winding structure 11 may have both ends T1 and T2 through which a signal is input and output. One end T1 of the winding structure 11 may be formed on the same layer as the winding structure 11, and the other end T2 may be formed on a different layer from the layer on which the winding structure 11 is formed, in the multilayer circuit board. The other end T2 may be formed as a conductive pattern 143 formed on another layer connected to the winding structure 11 through a conductive via 133 as illustrated in FIG. 1.

In the embodiment of the present invention, the terminal part may include a conductive via electrically connected to a region of the winding structure between the both ends thereof and a conductive pattern formed on a layer above or below the layer on which the winding structure is formed to thereby be electrically connected to the conductive via and form an external electrical connection.

According to the embodiment of the present invention, one or more terminal parts for forming an external electrical connection in a region between the both ends T1 and T2 of the winding structure 11 may be provided. The reference numerals '121' and '122' in FIG. 1 may indicate regions in which the one or more terminal parts are formed in the winding structure 11.

The winding structure 11 may be used as the series inductor array in which a plurality of inductors are connected in series by the terminal parts. That is, in the embodiment illustrated in FIG. 1, a region range of the winding structure from the one end T1 of the winding structure 11 to the region 121 in which a first terminal part is formed may be used as an inductor L1, a region range from the region 121 in which the first terminal part is formed to the region 122 in which a second terminal part is formed may be used as an inductor L2, and a region range from the region 122 in which the second terminal part is formed to the other end T2 of the winding structure may be used as an inductor L3. The above-mentioned embodiment, illustrated in FIG. 1, may be represented as a circuit illustrated in FIG. 2.

Figure 2:
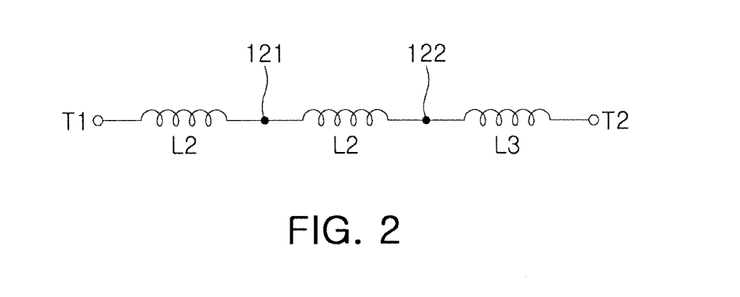
FIG. 2 is an equivalent circuit diagram of the series inductor array implemented as a single winding according to the embodiment of the present invention illustrated in FIG. 1.

FIG. 2 is an equivalent circuit diagram of the series inductor array implemented as a single winding according to the embodiment of the present invention illustrated in FIG. 1.

As described above, the series inductor array implemented as a single winding according to the embodiment of the present invention illustrated in FIG. 1 may be used as an array in which three inductors L1 to L3 illustrated in FIG. 2 are connected in series. In addition, the regions 121 and 122 of the winding structure 11 in which one or more terminal parts are formed may be used as a node for forming an electrical connection with external electrical and electronic devices, or the like.

Although a structure of the inductor array in which three inductors are connected in series is illustrated in FIGS. 1 and 2, the number of inductors may be easily changed according to the need of the electrical and electronic components or products in which the inductor is used.

Meanwhile, the terminal parts may be formed on the layer above or below the layer on which the winding structure 11 is formed in the multilayer circuit in order to avoid contact with the winding structure 11.

Figure 3:
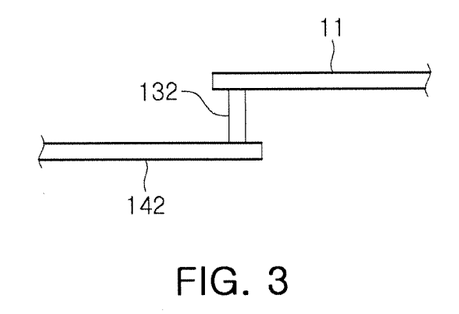
FIG. 3 is a side cross-sectional view taken along line 1 illustrated in FIG. 1.

FIG. 3, a side cross-sectional view taken along line 1 illustrated in FIG. 1, shows a structure of the terminal part.

As illustrated in FIG. 3, the terminal part may be configured of a conductive via 132 electrically connected to a region of the winding structure 11 between the both ends thereof and a conductive pattern 142 formed on the layer above or below the layer on which the winding structure 11 is formed to thereby be electrically connected to the conductive via 132. The case in which the conductive pattern 142 formed on the lower layer of the winding structure 11 is shown by way of example in FIG. 3, but the conductive pattern 142 may be formed on the upper layer thereof. However, in order to allow the inductors to be integrated with other external electrical and electronic components electrically connected to the inductors according to the embodiment of the present invention on a single board, it may be advantageous in view of a manufacturing process that the winding structure 11 and other electrical and electronic component are formed or mounted on the uppermost layer of the multilayer circuit board, and the conductive pattern 142 is formed on a lower layer thereof.

The conductive pattern 142 formed on the lower layer of the winding structure 11 may form electrical connections with other external electrical and electronic devices, or the like. Although not shown, in the case in which the electrical and electronic device to form the electrical connection, or the like, are formed or mounted on the same layer as the winding structure 11, a conductive via having a structure substantially equal to that of the conductive via 132 forming an electrical connection with the winding structure 11 is formed, such that the electrical connection with the layer on which the electrical and electronic device is formed or mounted may be formed.

In the above-mentioned series inductor array implemented as a single winding according to the embodiment of the present invention, since a circuit of at least two inductors connected in series may be implemented using a single winding structure, a layout area for forming the winding structure may be significantly decreased in implementing electrical and electronic components including a plurality of series inductors. In addition, the series inductor array may contribute to miniaturization and slimness of an overall electrical or electronic product.

Meanwhile, the present invention provides a filter including a series inductor array implemented as a single winding as described above.

The filter including a series inductor array implemented as a single winding according to the embodiment of the present invention may include the series inductor array as illustrated in FIG. 1 and an electrical device connected to the terminal parts of the series inductor array. As the electrical device, various types of passive device such as a capacitor, an inductor, a resistor, or the like, may be used. Particularly, in the case of the inductor, the inductor may be formed as a winding structure formed separately from the series inductor array as illustrated in FIG. 1.

The passive device may be formed on the same plane as the winding structure 11 of the series inductor array. Particularly, in the case in which an additional winding structure having inductance may be formed as the electrical device connected to the terminal parts of the inductor array, for convenience in a manufacturing process, the additional winding structure may be formed on the same plane as the winding structure 11 of the series inductor array. In addition, the filter according to the embodiment of the present invention may include a ground pattern formed on the same plane as the winding structure, as needed. The passive device may form an electrical connection with one or more terminal parts formed in the series inductor array. In the case in which the one or more terminal parts include conductive vias 131 and 132 formed in the layer above or below the winding structure 11 and conductive patterns 141 and 142 connected to the conductive vias 131 and 132, the passive device may be electrically connected to the conductive patterns 141 and 142 of the terminal parts through the separate conductive vias.

As described above, in the filter including the series inductor array implemented as a single winding according to the embodiment of the present invention, a layout structure for implementing the filter may be decreased due to a structural feature of the series inductor implemented as a single winding.

Hereinafter, as a high frequency low pass filter mainly applied to an output terminal of a power amplifier of a high frequency circuit to be used for impedance matching and removal of a harmonic component by way of example, the filter according to the present invention and a filter using a plurality of winding structures according to the related art will be compared with each other.

Figure 4:
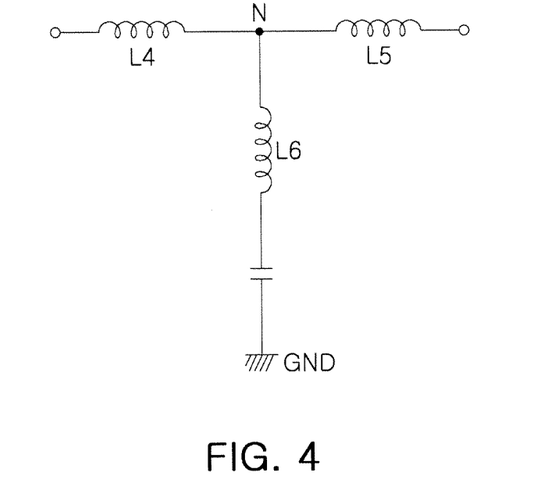
FIG. 4 is a circuit diagram of a general high frequency low pass filter.

FIG. 4 is a circuit diagram of a general high frequency low pass filter.

Referring to FIG. 4, the general high frequency low pass filter may include two inductors L4 and L5 connected in series to signal line through which a signal passes, and an inductor L6 and a capacitor C shunt-connected to a connection node N between the two inductors. According to an embodiment of the present invention, a series inductor array in which the two inductors L4 and L5 connected in series are implemented as a single winding as illustrated in FIG. 1 may be manufactured.

Figure 5:
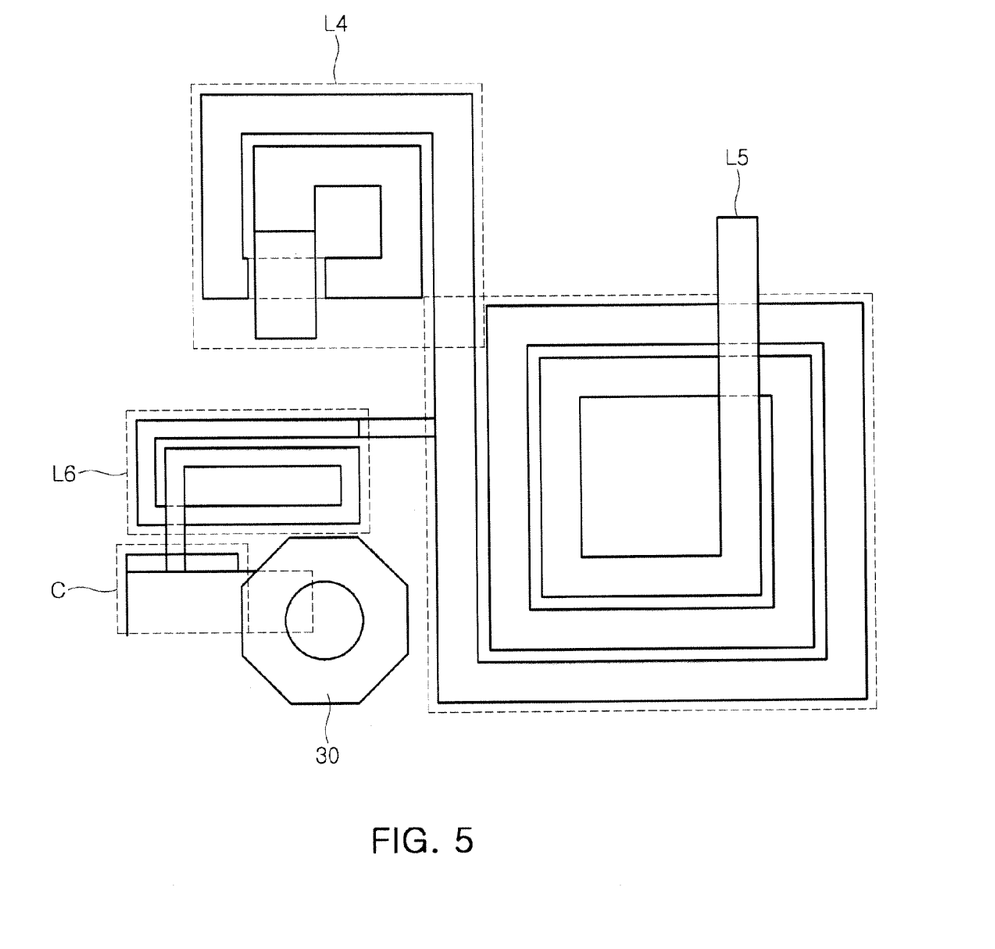
FIG. 5 is a plan view of the filter of FIG. 4, realized according to the related art.

FIG. 5 is a plan view of the filter of FIG. 4, realized according to the related art.

As illustrated in FIG. 5, in the high frequency low pass filter implemented according to the related art, in order to implement the two inductors L4 and L5 connected in series and the inductor L6 shunt-connected between the two series inductors, three winding structure are used. In addition, the high frequency low pass filter further includes the capacitor C connected to the inductor L6 and a ground pattern GND connected to the capacitor C. Approximately, the high frequency low pass filter implemented according to the related art as illustrated in FIG. 5 needs to have a width of 370 μm and a length of 300 μm, that is, a layout area of about 111,000 μm$^2$.

Figure 6:
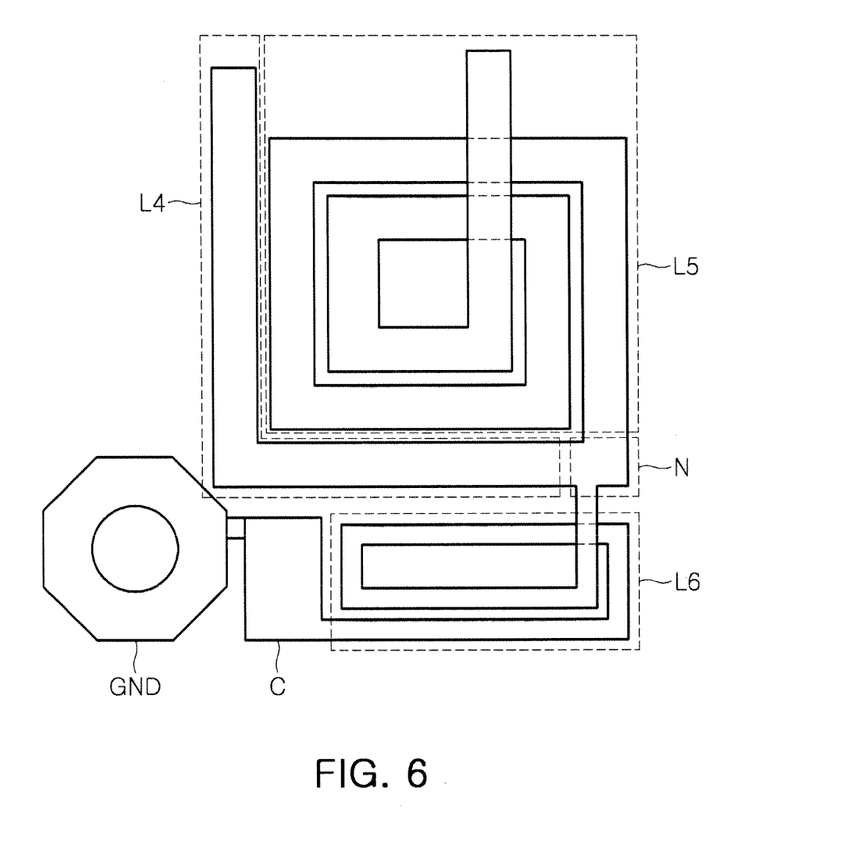
FIG. 6 is a plan view of the filter of FIG. 4, realized using the series inductor array implemented as a single winding according to the embodiment of the present invention.

FIG. 6 is a plan view of the filter of FIG. 4, realized using the series inductor array implemented as a single winding according to the embodiment of the present invention.

As illustrated in FIG. 6, the filter implemented using the series inductor array implemented as a single winding according to the embodiment of the present invention may be realized as two windings. The inductors L4 and L5 connected in series may be implemented as a single winding structure, and an inductor shunt-connected to the connection node N between the two inductors L4 and L5 connected in series may be implemented as the other winding structure. The inductors L4 and L5 connected in series are implemented as the inductor array according to the embodiment of the present invention. A region of the winding structure corresponding to the connection node N between the two inductors L4 and L5 may be provided with a terminal part, and the winding structure implementing the shunt-connected inductor L6 may be formed in the terminal part. The winding structure implementing the inductor L6 may be formed on the same layer as the winding structure implementing the two inductors L4 and L5 connected in series in the multilayer circuit. In addition, the inductor L6 may be connected to the capacitor C mounted on the same layer as that of the inductor L6, and the capacitor C may be connected to the ground pattern GND formed on the same layer as that of the capacitor C, in the multilayer circuit. The filter including the series inductor array implemented as a single winding according to the embodiment of the present invention illustrated in FIG. 6 may has a width of 260 μm and a length of 250 μm, such that a layout area thereof is about 65,000 μm$^2$. When compared with the filter according to the related art illustrated in FIG. 5, the filter according to the present invention may have a layout area decreased by about 30% or more.

As described above, since the filter including the series inductor array implemented as a single winding according to the embodiment of the present invention illustrated in FIG. 6 may decrease the number of winding structures as compared with the case of the filter in FIG. 5, the layout area for implementing the filter may be significantly decreased.

Figure 7:
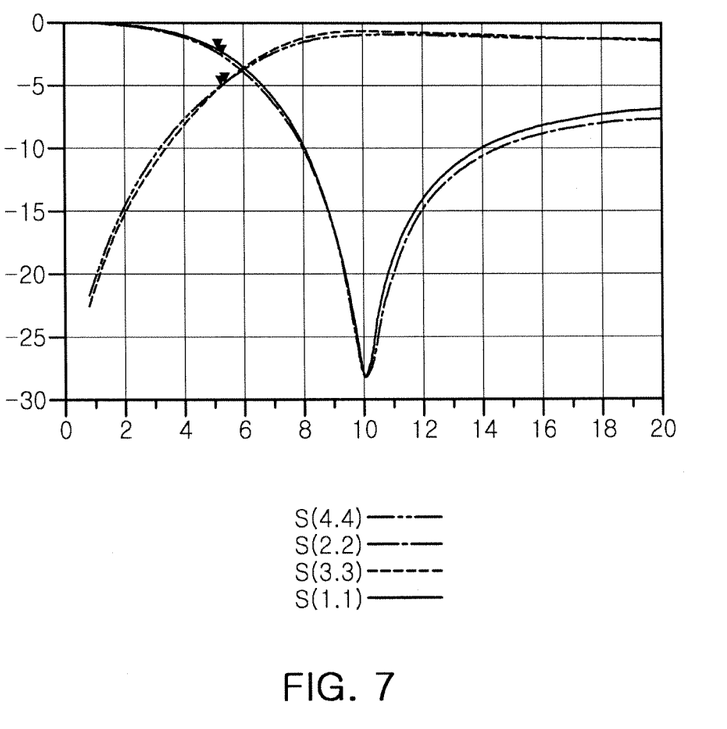
FIGS. 7 and 8 are views showing data for comparing high frequency characteristics of the filters illustrated in FIGS. 5 and 6.
Figure 8:
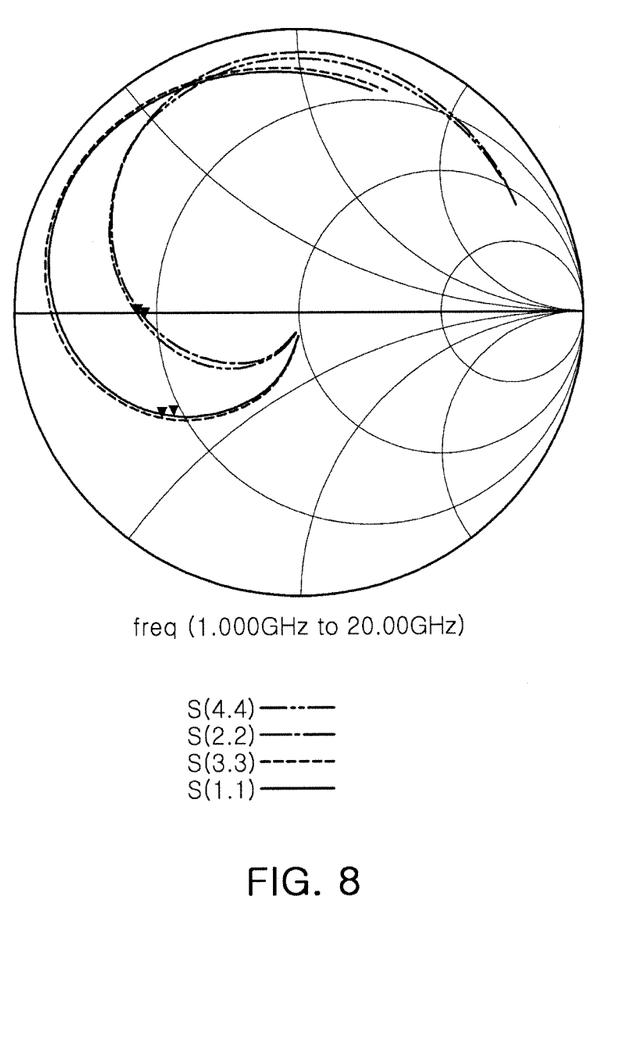

Meanwhile, results obtained by comparing the filters shown in FIGS. 5 and 6 with each other are shown in FIGS. 7 and 8. In FIGS. 7 and 8, a port 1 is an input port of the filter according to the related art shown in FIG. 5, and a port 2 is an output port of the filter according to the related art shown in FIG. 5. Further, in FIGS. 7 and 8, a port 3 is an input port of the filter according to the embodiment of the present invention shown in FIG. 6, and a port 4 is an output port of the filter according to the embodiment of the present invention shown in FIG. 6.

It may be confirmed that in the filter according to the related art and the filter according to the embodiment of the present invention, S-parameter characteristics are significantly similar to each other as illustrated in FIG. 7, and high frequency characteristics also are substantially equal to each other in the Smith Chart as illustrated in FIG. 8.

As described above, it may be confirmed that according to the embodiments of the present invention, the high frequency low pass filter having substantially equal performance without changing high frequency characteristics may be implemented, while having a further decreased layout area.

As set forth above, according to the embodiments of the present invention, since the circuit of at least two inductors connected in series may be implemented using a single winding structure, the layout area for forming the winding structure may be significantly decreased in implementing electrical and electronic components including a plurality of series inductors. In addition, the series inductor array may contribute to miniaturization and slimness of an overall electrical or electronic product.

While the present invention has been shown and described in connection with the embodiments, it will be apparent to those skilled in the art that modifications and variations can be made without departing from the spirit and scope of the invention as defined by the appended claims.

What is claimed is:

1. A series inductor array implemented as a single winding, the series inductor array comprising:
   a winding structure having both ends; and
   one or more terminal parts electrically connected to a region between the both ends of the winding structure to form an external electrical connection,
   wherein the winding structure has a structure in which a plurality of inductors having inductance formed in regions of the winding structure disposed between the both ends thereof and the terminal parts or between the terminal parts are connected in series, and
   wherein the series inductor array is implemented as a multilayer circuit, and the winding structure is formed as a conductive pattern on a single layer of the multilayer circuit.

2. The series inductor array of claim 1, wherein the one or more terminal parts include:
   a conductive via electrically connected to the region between the both ends of the winding structure; and
   a conductive pattern formed on a layer above or below the layer on which the winding structure is formed to be electrically connected to the conductive via and forming an external electrical connection.

3. A filter including a series inductor array implemented as a single winding, the filter comprising:
   a series inductor array including a first winding structure having both ends through which a signal is input and output and one or more terminal parts electrically connected to a region between the both ends of the first winding structure to form an external electrical connection, the first winding structure having a structure in which a plurality of inductors having inductance formed in regions of the first winding structure disposed between the both ends thereof and the terminal parts or between the terminal parts are connected in series; and
   an electrical device connected to the one or more terminal parts,
   wherein the series inductor array is implemented as a multilayer circuit, and the first winding structure is formed as a conductive pattern on a single layer of the multilayer circuit.

4. The filter of claim 3, wherein the one or more terminal parts connected to the electrical device include:
   a conductive via electrically connected to the region between the both ends of the first winding structure; and
   a conductive pattern formed on a layer above or below the layer on which the first winding structure is formed to be electrically connected to the conductive via and forming an electrical connection with the electrical device.

5. The filter of claim 4, wherein the electrical device is disposed on the layer on which the first winding structure is formed.

6. The filter of claim 3, further comprising a ground pattern formed on the layer on which the first winding structure is formed, to be connected to the electrical device.

7. The filter of claim 3, wherein the electrical device includes a capacitor.

8. The filter of claim 7, wherein the electrical device further includes a second winding structure connected between the one or more terminal parts and the capacitor to provide inductance.

9. The filter of claim 8, wherein the second winding structure and the first winding structure are formed on the same layer.

* * * * *